United States Patent [19]
Abe

[11] Patent Number: 5,866,456
[45] Date of Patent: Feb. 2, 1999

[54] METHOD FOR FABRICATING A SEMICONDUCTOR MEMORY DEVICE

[75] Inventor: Taro Abe, Kasaoka, Japan

[73] Assignee: Sharp Kabushiki Kaisha, Osaka, Japan

[21] Appl. No.: 716,900

[22] Filed: Sep. 20, 1996

[30] Foreign Application Priority Data

Mar. 19, 1996 [JP] Japan ................................ 8-063106

[51] Int. Cl.⁶ ............................................ H01L 21/8234
[52] U.S. Cl. ...................... 438/275; 438/233; 438/241; 438/264; 438/276
[58] Field of Search .................................. 438/233, 241, 438/264, 276, 279, 302, 168, 169

[56] References Cited

U.S. PATENT DOCUMENTS

| 5,045,489 | 9/1991 | Gill et al. ................................ 438/279 |
| 5,432,107 | 7/1995 | Uno et al. ................................ 438/276 |
| 5,614,432 | 3/1997 | Goto ........................................ 438/302 |

FOREIGN PATENT DOCUMENTS

| 61-288464 | 12/1986 | Japan . |
| 5-121698 | 5/1993 | Japan . |

*Primary Examiner*—Michael Trinh
*Assistant Examiner*—Khanh Duong
*Attorney, Agent, or Firm*—Nixon & Vanderhye P.C.

[57] ABSTRACT

A semiconductor memory device is provided which includes: a memory cell portion including at least one gate electrode formed on a semiconductor substrate and a plurality of source/drain regions formed in the semiconductor substrate and extending parallel to each other and perpendicular to the gate electrode, the gate electrode and the plurality of source/drain regions constituting a plurality of first conductivity type channel transistors; and a peripheral circuitry portion including a first conductivity type channel transistor having a gate electrode formed on the semiconductor substrate and source/drain regions; wherein channels of the first conductivity type channel transistors in the memory cell portion each have a higher impurity concentration than a channel of the first conductivity type channel transistor in the peripheral circuitry portion.

4 Claims, 11 Drawing Sheets

Depth in middle portion of channel in substrate

METHOD FOR FABRICATING A SEMICONDUCTOR MEMORY DEVICE

BACKGROUND OF THE INVENTION

1. Field of the Invention

The present invention relates to semiconductor memory devices and fabrication methods therefor. More particularly, the invention relates to semiconductor memory devices having MOS field effect transistors (FETs) of a planar cell structure, and to fabrication methods therefor.

2. Description of the Related Arts

For higher-level integration of a semiconductor memory device of the type which includes MOS FETs formed in a memory cell portion and peripheral circuitry portion thereof, a construction shown in FIG. 1 has been proposed.

To fabricate such a semiconductor memory device, a plurality of source/drain regions 2a each serving as a bit line are formed in a generally parallel relation in a memory cell portion M of a semiconductor substrate 1.

In turn, gate electrodes 3a each serving as a word line and extending perpendicular to the source/drain regions 2a are formed on the source/drain regions 2a with intervention of a gate insulation film (not shown) and, at the same time, a gate electrode 3b of MOS FETs is formed in a peripheral circuitry portion C.

Subsequently, source/drain regions 2b of the MOS FETs are formed in the peripheral circuitry portion C by way of ion implantation using the gate electrode 3b as a mask.

Device isolation is achieved by implanting into the memory cell portion M an impurity of a conductivity type opposite to that of an impurity contained in the source/drain regions 2a with the use of the gate electrodes 3a as a mask. Threshold voltages (Vth) of channels of the transistors formed in the memory cell portion M and the peripheral circuitry portion C are controlled by ion implantation over the entire surface of the substrate.

Such a semiconductor memory device, in general, suffers from deterioration in the characteristics of the MOS FETs, e.g., variation in the threshold voltage Vth, distortion of a V-I saturation characteristic curve and reduction in the operation speed, which may be caused due to a so-called short channel effect when the channel length is reduced for micro-fabrication of the MOS FETs in the peripheral circuitry portion.

To cope with this problem, a drain engineering technique is employed to suppress the short channel effect of the MOS FETs in the peripheral circuitry portion C. More specifically, a shallow LDD (lightly doped drain) region is formed to reduce expanse of an electric field from the drain region to a channel region and, in a step subsequent to the formation of the gate electrode, impurity ions of a conductivity type opposite to that of the impurity contained in the source/drain regions are implanted into a region adjacent to the shallow LDD region in self-alignment with the gate electrode.

In another method, a shallow LDD region is formed like the aforesaid method, and the impurity concentration around the surface of the channel region is set higher, while expanse of the electric field from the drain region to the channel region is reduced.

In the process for forming the MOS FETs in the memory cell portion of the planar cell structure, however, the formation of the source/drain regions thereof is carried out in a step precedent to the formation of the gate insulation film, followed by the formation of the gate electrode thereof and the formation of the source/drain regions of the MOS FETs in the peripheral circuitry portion. Accordingly, it is difficult to allow the source/drain regions in the memory cell portion to have a reduced depth. Thus, the source/drain regions in the memory cell portion each have a greater depth than the source/drain regions of the MOS FETs in the peripheral circuitry portion, so that a variation in the potential of a deeper portion of a channel of each transistor in the memory cell portion cannot be suppressed which is caused due to upward expanse of an electric field generated around a drain of the transistor. Hence, the short channel effect cannot be suppressed.

In the MOS FET of the memory cell portion of the planar cell structure, the source/drain regions thereof overlap the gate electrode, so that impurity ions of a conductivity type opposite to that of the impurity contained in the source/drain regions cannot be implanted in a region adjacent to the LDD region in self-alignment with the gate electrode, unlike the aforesaid drain engineering technique. This makes it impossible to achieve higher-level integration of memory cells.

An exemplary method considered to be effective for suppressing the short channel effect of the MOS FETs in the memory cell portion of the planar cell structure is to increase the threshold voltage Vth by increasing the impurity concentration in the channels thereof. In a presently available semiconductor fabrication process, however, the threshold voltages Vth of the channel regions of the transistors in the memory cell portion and the peripheral circuitry portion are controlled by ion implantation over the entire surface of the semiconductor substrate. Therefore, it is difficult to control only the threshold voltages of the MOS FETs in the memory cell portion (see FIGS. 13 and 14). Further, since the MOS FETs in the peripheral circuitry portion should be operated at a relatively high speed in the semiconductor device, it is not preferable to increase the threshold voltages Vth thereof. More specifically, an extremely high threshold voltage Vth results in a reduced current flowing through the transistors in the peripheral circuitry portion. Further, it is disadvantageous that it takes a long time before the transistors are turned on when current is supplied to the gate electrode of the transistors.

In accordance with a conventional technique related to the semiconductor memory device of the so-called planar cell structure, the integration level of the semiconductor memory device cannot be increased by suppressing the short channel effect of the transistors in the memory cell portion while allowing the transistors in the peripheral circuitry portion to operate at a relatively high speed. Therefore, it is currently impossible to achieve the higher-speed operation and higher-level integration of the semiconductor memory device of the planar cell structure.

SUMMARY OF THE INVENTION

In accordance with a first aspect of the present invention, there is provided a first semiconductor memory device comprising: a memory cell portion including at least one gate electrode formed on a semiconductor substrate and a plurality of source/drain regions formed in the semiconductor substrate and extending parallel to each other and perpendicular to the gate electrode, the gate electrode and the plurality of source/drain regions constituting a plurality of first conductivity type channel transistors; and a peripheral circuitry portion including a first conductivity type channel transistor having a gate electrode formed on the semiconductor substrate and source/drain regions; wherein channels of the first conductivity type channel transistors in the memory cell portion each have a higher impurity concentration than a channel of the first conductivity type channel transistor in the peripheral circuitry portion.

In accordance with a second aspect of the present invention, there is provided a second semiconductor memory device comprising: a memory cell portion including at least one gate electrode formed on a semiconductor substrate and a plurality of source/drain regions formed in the semiconductor substrate and extending parallel to each other and perpendicular to the gate electrode, the gate electrode and the plurality of source/drain regions constituting a plurality of first conductivity type channel transistors; and a peripheral circuitry portion including a first conductivity type channel transistor having a gate electrode formed on the semiconductor substrate and source/drain regions; wherein the first conductivity type channel transistors in the memory cell portion each include a channel having a higher impurity concentration at least in a peripheral portion thereof adjacent to a source region than in a middle portion thereof.

In accordance with a third aspect of the present invention, there is provided a method for fabricating the first semiconductor memory device, comprising the steps of: (i-a) forming a mask having a desired configuration on a memory cell portion of a semiconductor substrate, and implanting an impurity of a first conductivity type into the semiconductor substrate with the use of the mask to form a plurality of source/drain regions of the first conductivity type extending parallel to each other; (ii-a) forming on the semiconductor substrate a mask having an opening at least on the memory cell portion, and implanting an impurity of a second conductivity type into the semiconductor substrate with the use of the mask; and (iii-a) forming at least one gate electrode extending perpendicular to the plurality of source/drain regions of the first conductivity type on the memory cell portion.

In accordance with a fourth aspect of the present invention, there is provided another method for fabricating the first semiconductor memory device, comprising the steps of: (i-b) forming a mask having a desired configuration on a memory cell portion of a semiconductor substrate, and implanting an impurity of a first conductivity type into the semiconductor substrate with the use of the mask to form a plurality of source/drain regions of the first conductivity type extending parallel to each other; (ii-b) forming at least one gate electrode extending perpendicular to the plurality of source/drain regions of the first conductivity type on the memory cell portion; (iii-b) forming on the semiconductor substrate a mask having an opening at least on the memory cell portion; (iv-b) implanting impurity ions of a second conductivity type into a portion of a surface layer of the semiconductor substrate and into a surface layer of the gate electrode with the use of the mask; and (v-b) implanting impurity ions of the second conductivity type through the gate electrode with the use of the mask to cause the impurity ions to reach a portion of the surface layer of the semiconductor substrate below the gate electrode, the step (v-b) either preceding or following the step (iv-b).

In accordance with a fifth aspect of the present invention, there is provided a method for fabricating the second semiconductor memory device, comprising the steps of: (i-c) forming a mask having a desired configuration on a memory cell portion of a semiconductor substrate; (ii-c) implanting an impurity of a first conductivity type into the semiconductor substrate along a line normal to a surface of the substrate with the use of the mask to form a plurality of source/drain regions of a first conductivity type extending parallel to each other; (iii-c) implanting an impurity of a second conductivity type into the semiconductor substrate at an angle with respect to the line normal to the surface of the substrate with the use of the mask to allow each of channels defined between the source/drain regions to have a higher impurity concentration at least in a peripheral portion thereof adjacent to a source region of the first conductivity type than in a middle portion thereof, the step (iii-c) either preceding or following the step (ii-c); and (v-c) forming at least one gate electrode extending perpendicular to the plurality of source/drain regions of the first conductivity type in the memory cell portion.

DETAILED DESCRIPTION OF THE PREFERRED EMBODIMENTS

Figure 1:
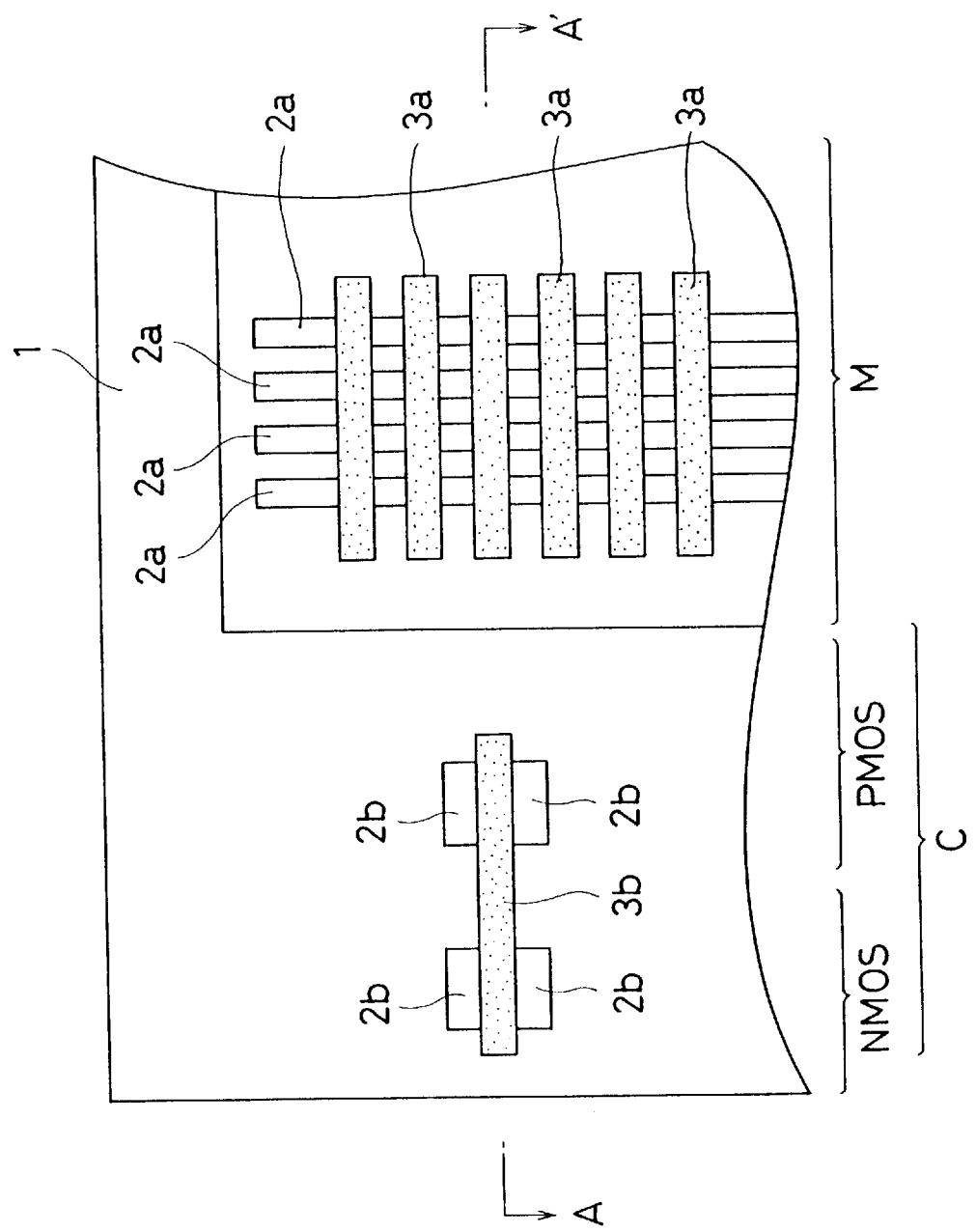
FIG. 1 is a schematic plan view illustrating major portions of one exemplary semiconductor memory device in accordance with the present invention.

Semiconductor memory devices of the present invention comprise a peripheral circuitry portion and a memory cell portion of a flat cell structure, which are formed on a single semiconductor substrate.

The memory cell portion includes at least one gate electrode formed on the semiconductor substrate with intervention of a gate insulation film, and source/drain regions formed in the semiconductor substrate and extending perpendicular to the gate electrode. The gate electrode and the source/drain regions constitute one or more MOS field effect transistors. The gate insulation film is formed of a commonly used material such as $SiO_2$ in a thickness of about 10 Å to about 150 Å. The gate electrode is formed of a commonly used material such as polysilicon, silicide or polycide in a desired line width and a thickness of about 800 Å to about 5,000 Å. The source/drain regions may contain an impurity of either N-type or P-type conductivity, e.g., arsenic, boron or the like, in a concentration of $10^{20}$ cm$^{-3}$ to $10^{21}$ cm$^{-3}$. The memory cell portion may include at least one transistor with a channel of either N-type or P-type, but is preferably formed with a plurality of gate electrodes extending generally parallel to each other and includes a plurality of transistors. Alternatively, the memory cell portion may include a plurality of gate electrodes and a plurality of source/drain regions extending perpendicular to the plurality of gate electrodes. The memory cell portion may serve as an MROM, an EPROM, an EEPROM, a DRAM, an FRAM or the like, but is preferably used for the MROM.

The peripheral circuitry portion includes at least one MOS field effect transistor having a gate electrode formed on the semiconductor substrate with intervention of a gate insulation film, and source/drain regions formed in self-alignment with the gate electrode. The gate insulation film and the gate electrode may respectively be formed of the same materials as those for the transistor in the memory cell portion. The source/drain regions are preferably formed in self-alignment with the gate electrode in the same impurity concentration as that for the transistor in the memory cell portion. The transistor in the peripheral circuitry portion has a channel of either P-type or N-type which is the same as that of the transistors in the memory cell portion, but may comprise a CMOS having N-type and P-type channel transistors. Where the peripheral circuitry portion includes a transistor with a channel of a conductivity type different from that of the transistors in the memory cell portion, at least one impurity region of either N-type or P-type is preferably formed as a well in the peripheral circuitry portion of the semiconductor substrate. The impurity region preferably has a surface concentration of about $10^{17}$ cm$^{-3}$ to about $10^{18}$ cm$^{-3}$.

In the first semiconductor memory device of the present invention, the channels of the transistors in the memory cell portion each have a higher impurity concentration than the channel of the transistor in the peripheral circuitry portion. Where the channel of the transistor in the peripheral circuitry portion has a surface impurity concentration of about $1 \times 10^{17}$ cm$^{-3}$ to about $2 \times 10^{17}$ cm$^{-3}$ for example, the channels of the transistors in the memory cell portion preferably each have a surface impurity concentration of about $2 \times 10^{17}$ cm$^3$ to about $4 \times 10^{17}$ cm$^{-3}$. Thus, the short channel effect in the memory cell portion can be prevented while a high-speed operation in the peripheral circuitry portion is ensured.

In the second semiconductor memory device of the present invention, the channels of the transistors in the memory cell portion each have a higher impurity concentration at least in a peripheral portion thereof adjacent to a source region than in a middle portion thereof. Where the source/drain regions of the transistors in the memory cell portion have a first conductivity type impurity concentration of about $10^{20}$ cm$^{-3}$ to about $10^{21}$ cm$^{-3}$ and the channels of the transistors in the memory cell portion each have a second conductivity type impurity concentration of about $1 \times 10^{17}$ cm$^{-3}$ to about $2 \times 10^{17}$ cm$^{-3}$ in a middle surface portion thereof, for example, the channels preferably each have a second conductivity type impurity concentration of about $2 \times 10^{17}$ cm$^{-3}$ $4 \times 10^{17}$ cm$^{-3}$ at least in a peripheral surface portion thereof adjacent to the source region. The region having a higher impurity concentration may be provided not only adjacent the source region but also adjacent the drain region or in the entire periphery of the channel. The middle portion of the channel of each transistor in the memory cell portion may have an impurity concentration substantially equivalent to the impurity concentration in the channel of the transistor in the peripheral circuitry portion.

Where the memory cell portion of the first or second semiconductor memory device according to the present invention serves as an MROM, the threshold voltages of desired transistors are set at a low level or at a high level depending on ROM data to be written therein. As long as the aforesaid conditions are satisfied, the threshold voltages may be of binary levels or of multiple levels.

Figure 15:
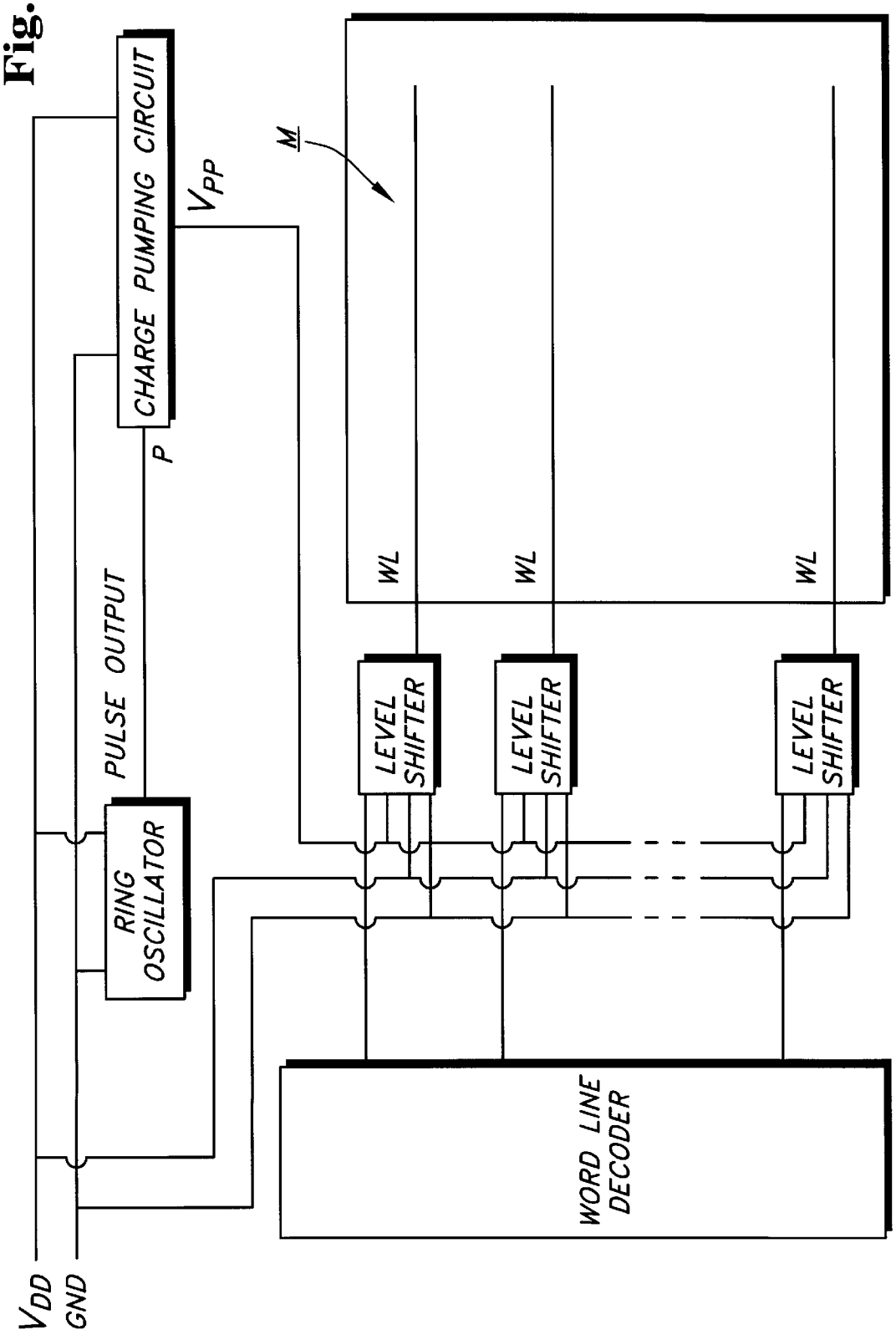
FIG. 15 is a schematic circuit diagram of another exemplary semiconductor memory device in accordance with the present invention.

In the first or second semiconductor memory device of the present invention, the first conductivity type channel transistors in the memory cell portion are preferably each connected to a driver circuit for controlling a gate voltage to be supplied thereto. Further, a boost circuit is preferably connected to the driver circuit to supply thereto a voltage higher than a supply voltage supplied to the semiconductor memory device. Alternatively, a circuit functioning as the driver circuit and the boost circuit may be connected to the memory cell portion. An exemplary construction of the semiconductor memory device according to the present invention is shown in FIG. 15. As shown, the semiconductor memory device includes a ring oscillator, a charge pumping circuit, level sifters and the like. The charge pumping circuit shown in FIG. 15 generates a voltage $V_{pp}$ higher than a supply voltage $V_{DD}$ within the semiconductor memory device. The voltage $V_{pp}$ is applied to the respective level shifters. Outputs of a word line decoder which are equal to or lower than the supply voltage $V_{DD}$ are applied to the respective level shifters. The level shifters each output a voltage higher than the supply voltage $V_{DD}$ to a corresponding word line in the memory cell portion.

Figure 16:
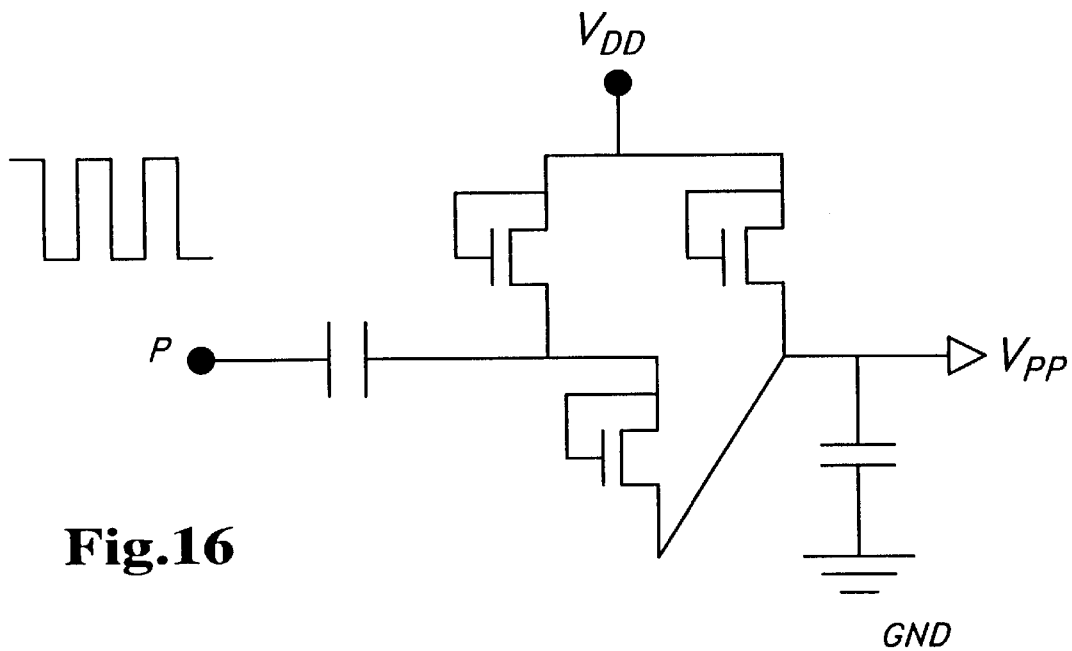
FIG. 16 is a schematic circuit diagram of a charge pumping circuit to be mounted on the semiconductor memory device.
Figure 17:
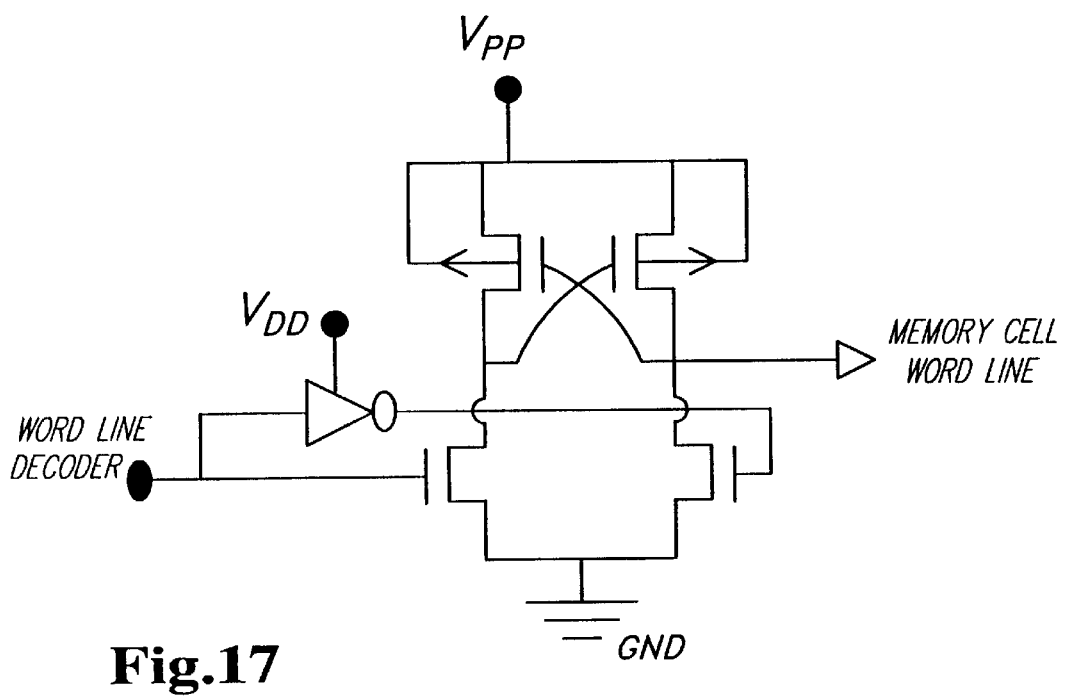
FIG. 17 is a schematic circuit diagram of a level shifter circuit to be mounted on the semiconductor memory device.

The constructions of the charge pumping circuit and the level shifter are shown in FIGS. 16 and 17, respectively. The charge pumping circuit of FIG. 16 is connected to GND, $V_{DD}$ and a pulse output part of the ring oscillator, and generates the voltage $V_{PP}$ higher than the supply voltage $V_{DD}$ by means of a boost circuit provided therein. The level shifter of FIG. 17 is connected to GND, $V_{DD}$, a $V_{pp}$ output port of the charge pumping circuit and an output port of the word line decoder, and serves to convert the voltage amplitude of the output of the word line decoder from GND•$V_{DD}$ into GND•$V_{pp}$ to drive a word line in the memory cell portion.

In a method for fabricating the first semiconductor memory device, a mask having a desired configuration is first formed on a memory cell portion of a semiconductor substrate in the step (i-a). The formation of the mask is achieved by applying a commonly used resist on the substrate and patterning it into the desired configuration by a photolithographic method. A plurality of source/drain regions of a first conductivity type extending parallel to each other are formed in the memory cell portion by implanting an impurity of the first conductivity type into the semiconductor substrate along a line normal to a surface of the substrate with the use of the mask. Examples of the impurity to be implanted include phosphorus ions and arsenic ions for N-type conductivity. The implantation employs a dose of about $10^{15}$ cm$^{-2}$ to about $10^{16}$cm$^{-2}$ and an implantation energy of about 10 keV to about 100 keV. Prior to the formation of the source/drain regions, an impurity region such as an N-type well or a P-type well may be formed in the semiconductor substrate as required, and ions may be implanted over the entire surface of the semiconductor substrate for threshold voltage control. Further, a device isolation film may be formed to isolate the memory cell portion from a peripheral circuitry portion and to define a device isolation region.

In the step (ii-a), a mask having an opening at least on the memory cell portion is formed on the resulting substrate. The formation of the mask can be achieved in the same manner as described above. The mask to be formed at this time is adapted to mask at least a region in the peripheral circuitry portion provided for formation of transistors having the same conductivity type as that of transistors in the memory cell portion. The mask may have an opening on the other region. Where a transistor having a conductivity type different from that of the transistors in the memory cell portion is also to be formed in the peripheral circuitry portion, for example, the mask may have an opening on a region where the transistor is to be formed. By using the mask, an impurity of a second conductivity type, i.e., an impurity having a conductivity type different from that of the semiconductor substrate, is implanted into the substrate. The ion implantation preferably employs a dose of about $1\times10^{12}$ $cm^{-2}$ to about $2\times10^{12}$ $cm^{-2}$ and an implantation energy of about 10 keV to about 50 keV. In this step, the impurity concentration in channels of the transistors in the memory cell portion is controlled to be about $2\times10^{17}$ $cm^{-3}$ to about $4\times10^{17}$ $cm^{-3}$. Thus, a channel of the transistor in the peripheral circuitry portion has a higher impurity concentration than the channels of the transistors in the memory cell portion which have the same conductivity type.

In the step (iii-a), at least one gate electrode extending perpendicular to the previously formed source/drain regions of the first conductivity type is formed of any of the aforesaid materials in a desired configuration on the memory cell portion of the semiconductor substrate with intervention of the gate insulation film by a known method. At this time, gate electrodes serving for other transistors in the peripheral circuitry portion and the memory cell portion may be formed. Where an insulation film or the like is used as a patterning mask for the formation of the gate electrode, the insulation film may be allow to remain on the gate electrode and, further, sidewall spacers and the like may be formed.

Thereafter, source/drain regions are formed in the peripheral circuitry portion of the semiconductor substrate in self-alignment with the gate electrode by using a mask and the like having an opening only on the peripheral circuitry portion. Further, known steps such as for formation of an inter-layer insulation film, contact holes and interconnection layer are conducted. Thus, the semiconductor memory device is completed. Mask ROM data writing may be carried out at a proper stage after or during these steps.

In another method for fabricating the first semiconductor memory device, the step (i-b) is performed in the same manner as in the step (i-a). Thereafter, at least one gate electrode extending perpendicular to the source/drain regions of the first conductivity type is formed on the memory cell portion in the step (ii-b). The formation of the gate electrode in the step (ii-b) is achieved in the same manner as in the step (iii-a).

In the step (iii-b), a mask having an opening at least on the memory cell portion is formed on the semiconductor substrate in the same manner as in the step (ii-a).

In the step (iv-b), impurity ions of the second conductivity type are implanted into a portion of a surface layer of the semiconductor substrate and into a surface layer of the gate electrode by using the mask. The ion implantation is performed to control the impurity concentration in the portion of the surface layer of the semiconductor substrate not formed with the gate electrode at a higher level. Where boron ions or the like are employed as the impurity, for example, the ion implantation employs a dose of about $5\times10^{12}$ $cm^{-2}$ to about $5\times10^{13}$ $cm^{-2}$ and an implantation energy of about 5 keV to about 50 keV.

In the step (v-b), impurity ions of the second conductivity type are implanted through the gate electrode with the use of the aforesaid mask so that the impurity ions reach a portion of the surface layer of the semiconductor substrate below the gate electrode. More specifically, the ion implantation performed at this stage allows the portion of the surface layer of the semiconductor substrate formed with the gate electrode to have an increased impurity concentration. Where boron ions or the like are used as the impurity, for example, the ion implantation employs a dose of about $1\times10^{12}$ $cm^{-2}$ to about $2\times10^{12}$ $cm^{-2}$ and an implantation energy of about 100 keV to about 300 keV. The step (v-b) may either precede or follow the step (iv-b). These steps allow the portion of the surface layer of the semiconductor substrate formed with the gate electrode in the memory cell portion to have a uniform impurity concentration of about $2\times10^{17}$ $cm^{-3}$ to about $4\times10^{17}$ $cm^{-3}$ which is higher than the impurity concentration in the channel of the transistor in the peripheral circuitry portion which has the same conductivity type.

Processes to be thereafter performed are the same as in the method previously described.

In a method for fabricating the second semiconductor memory device, a mask is formed on a semiconductor substrate in the step (i-c) in the same manner as in the step (i-a).

In the step (ii-c), source/drain regions are formed in the same manner as in the step (i-a) with the use of the mask.

In the step (iii-c), an impurity of a conductivity type different from that of the impurity used for the formation of the source/drain regions is implanted into the substrate with the use of the aforesaid mask. Boron ions, for example, are implanted into the semiconductor substrate in a dose of $10^{13}$ $cm^{-2}$ to $10^{14}$ $cm^{-2}$ at an implantation energy of about 10 keV to about 50 keV at an angle more than 0° and 45° or less with respect to a line normal to a surface of the substrate. One-direction ion implantation is performed to implant the impurity ions into a portion of the periphery of a channel adjacent to the source region, or two-direction ion implantation is performed to implant the impurity ions into portions of the periphery of the channel adjacent to the source region and the drain region. Alternatively, rotation ion implantation may be performed by rotating the semiconductor substrate about the normal line to implant the impurity ions into the entire peripheral portion of the channel. The step (iii-c) may either precede or follow the step (ii-c). Thus, the first conductivity type channel of the transistor in the memory cell portion has a higher impurity concentration in a desired portion thereof than in a middle portion thereof.

In the step (iv-c), at least one gate electrode extending perpendicular to the source/drain regions of the first conductivity type is formed in the memory cell portion. This process may be performed in the same manner as in the step (iii-a).

Driver circuits and a boost circuit which are to be connected to the semiconductor memory device or mounted thereon may be formed during the aforesaid steps or in a separate step.

Embodiments of the semiconductor memory devices according to the present invention will hereinafter be described with reference to the attached drawings.

Embodiment 1

As shown in FIG. 1, a semiconductor memory device of the present invention includes a memory cell portion M and a peripheral circuitry portion C which are defined on a semiconductor substrate. The memory cell portion M has a plurality of source/drain regions 2a formed in a parallel relation and serving as bit lines, and gate electrodes 3a formed on the source/drain regions 2a in a perpendicular relation thereto with intervention of a gate insulation film (not shown) and serving as word lines. The peripheral circuitry portion C has a PMOS region and an NMOS region, for example, each including a transistor having a gate electrode 3b and source/drain regions 2b formed in self-alignment with the gate electrode 3b.

Figure 2:
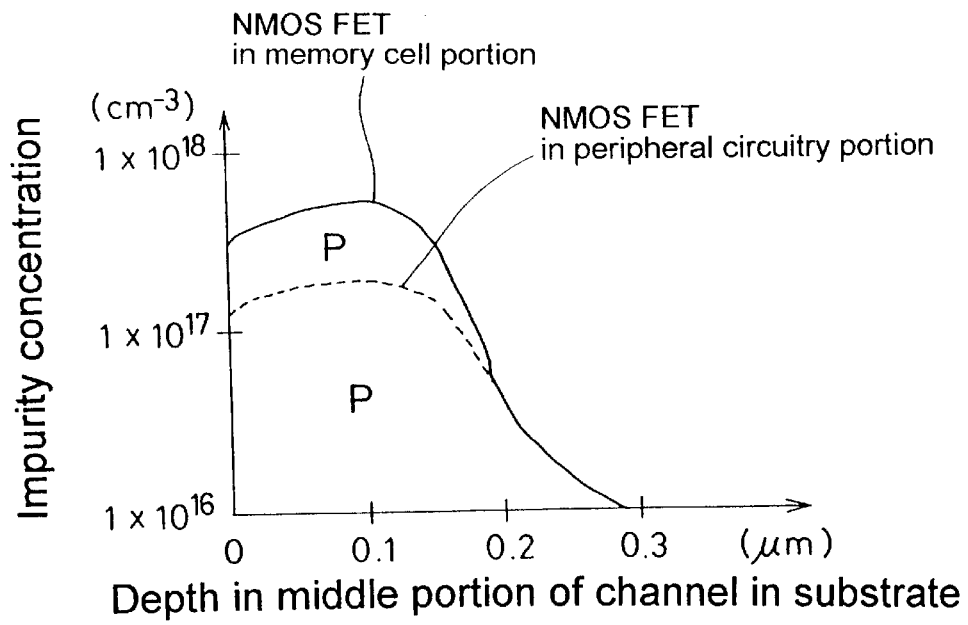
FIG. 2 is a graphical representation illustrating impurity profiles in channels of transistors in a memory cell portion and a peripheral circuitry portion in the semiconductor memory device.
Figure 3:
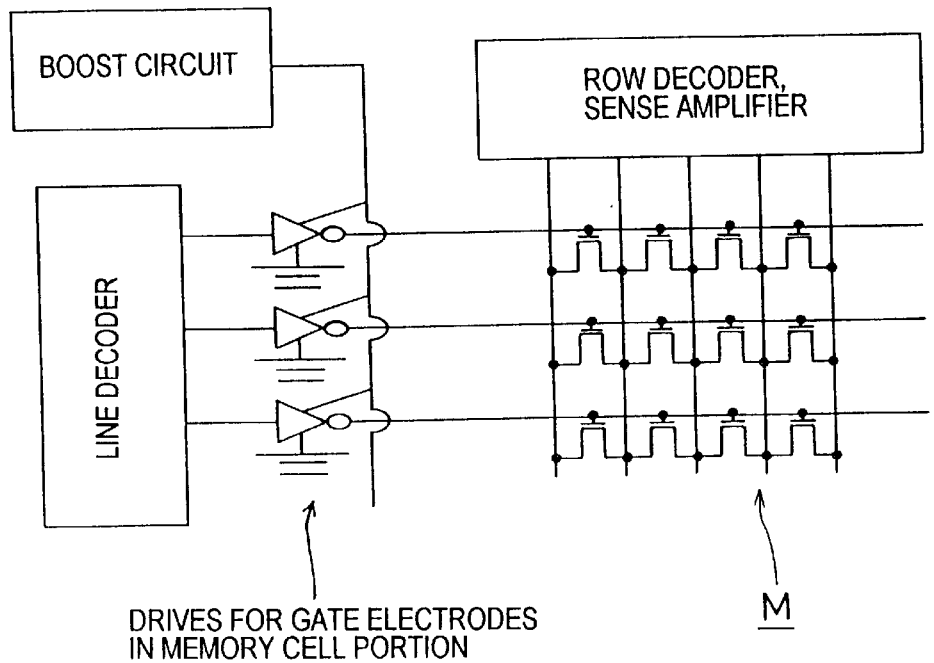
FIG. 3 is a diagram illustrating an exemplary circuit of the semiconductor memory device.

Impurity profiles in middle portions of channels of the transistors in the memory cell portion M and the peripheral circuitry portion C of the semiconductor memory device are shown in FIG. 2. In the semiconductor memory device, the impurity concentration in the channels of the transistors in the memory cell portion is set higher, while the impurity profile in the channels of the transistors in the peripheral circuitry portion C is controlled by a conventional method. This suppresses the short channel effect which would occur in the transistors in the memory cell portion M, thereby permitting higher integration.

In the semiconductor memory device, the transistors in the memory cell portion M are connected to line decoders via the word lines thereof and to row decoders and/or a sense amplifier via the bit lines thereof. The word lines are each connected to a driver circuit for controlling a gate voltage. The driver circuit is connected to a boost circuit for supplying thereto a voltage higher than a supply voltage to the semiconductor memory device.

A method for fabricating the semiconductor memory device will be described with reference to FIGS. 4 to 6, which are sectional views taken along a line A–A' of FIG. 1.

Figure 4:
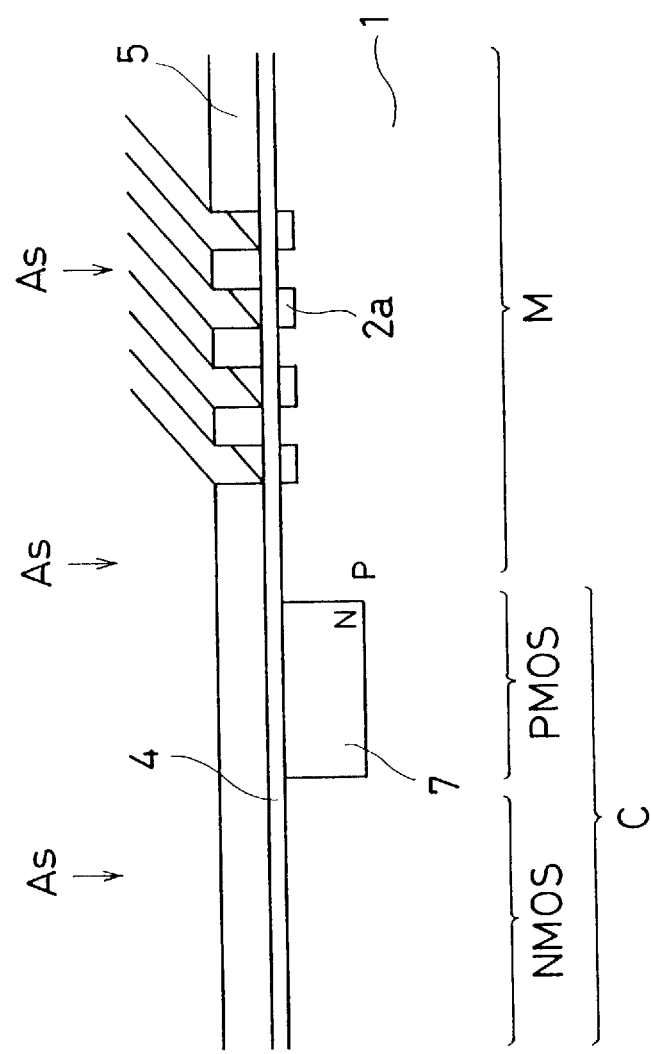
FIGS. 4 to 6 are schematic sectional views for explaining a fabrication process for the semiconductor memory device in accordance with one embodiment of the present invention.

As shown in FIG. 4, an N-type region 7 having a surface impurity concentration of about $2 \times 10^{17}$ cm$^{-3}$ is formed in a desired region of a P-type semiconductor substrate 1 for formation of a PMOS in a peripheral circuitry portion C, and a gate insulation film 4 is formed over the entire surface of the semiconductor substrate 1. Thereafter, a mask pattern 5 having a plurality of elongate openings extending parallel to each other on a memory cell portion M is formed on the resulting substrate. By using the mask pattern 5 as a mask, arsenic ions, for example, are implanted into the substrate in a dose of about $5 \times 10^{15}$ cm$^{-2}$ at an implantation energy of about 50 keV for formation of source/drain regions 2a in the memory cell portion M.

Figure 5:
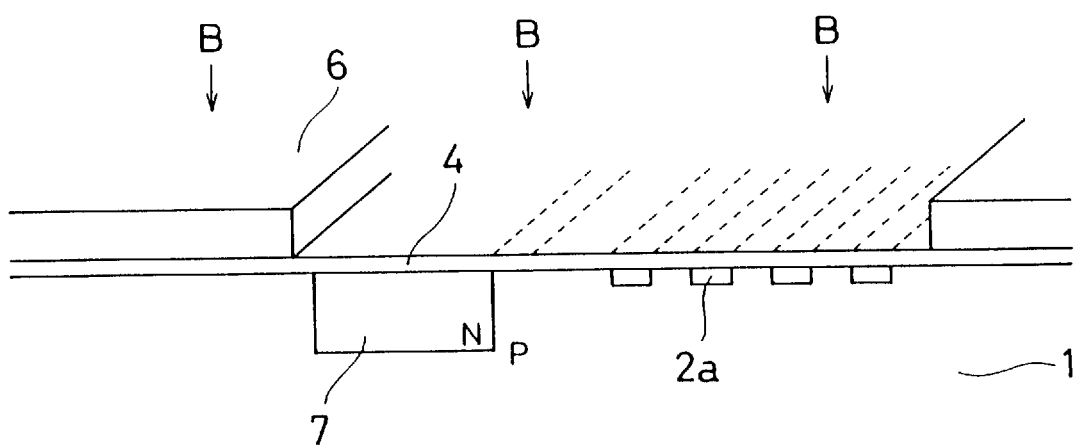

In turn, as shown in FIG. 5, a mask pattern 6 for ion implantation is formed on the resulting substrate. By using the mask pattern 6 as a mask, P-type impurity ions such as boron ions are implanted into the memory cell portion M and into the PMOS formation region in the peripheral circuitry portion C in a dose of about $5 \times 10^{12}$ cm$^{-2}$ at an implantation energy of about 20 keV. The ion implantation allows the memory cell portion M to have a higher impurity concentration than an NMOS formation region in the peripheral circuitry portion C. At the same time, the effect of the P-type impurity is counteracted by the impurity contained in the previously formed N-type region 7 (the PMOS formation region) of the peripheral circuitry portion C.

Figure 6:
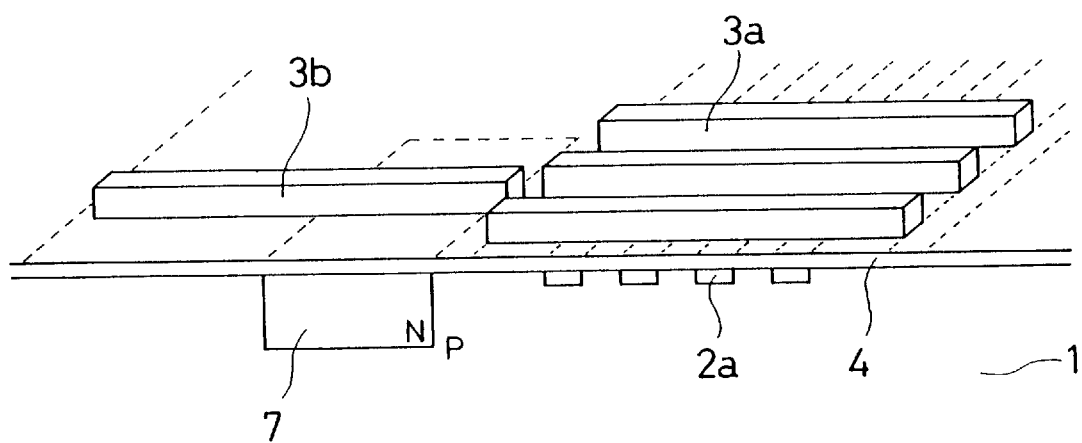

As shown in FIG. 6, a plurality of gate electrodes 3a extending perpendicular to the source/drain regions 2a are formed in the memory cell portion M and, at the same time, a gate electrode 3b is formed in the peripheral circuitry portion C.

Thereafter, source/drain regions 2b are formed in the peripheral circuitry portion C by ion implantation using the gate electrode 3b as a mask. An inter-layer insulation film, metal interconnections and the like are formed, and then ROM data writing is performed. Thus, the semiconductor memory device is completed.

Embodiment 2

Another method for fabricating the semiconductor memory device described in Embodiment 1 will herein be described with reference to FIGS. 7 to 9, which are sectional views taken along the line A–A' of FIG. 1.

Figure 7:
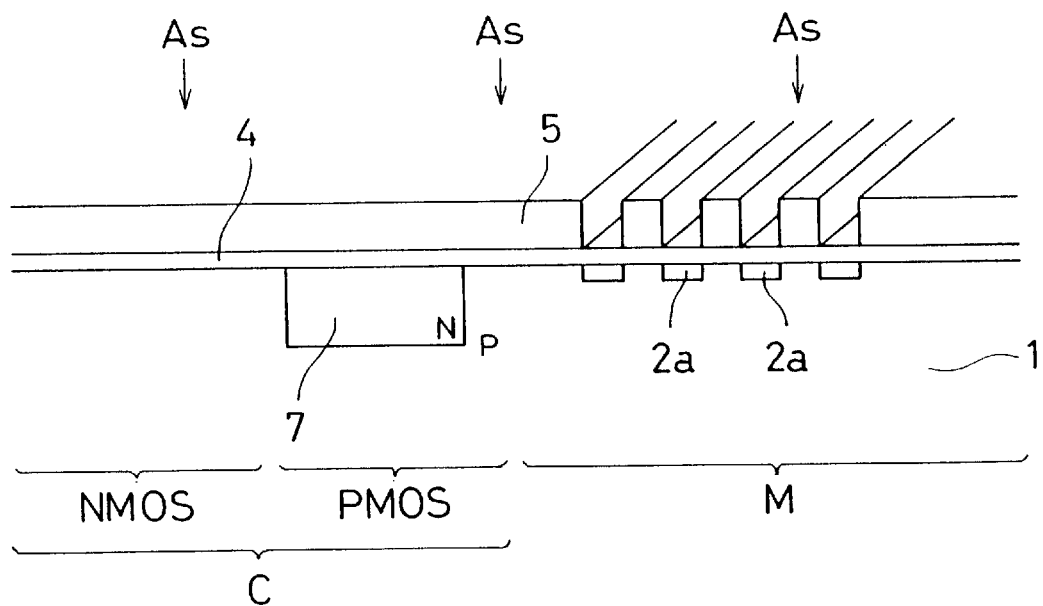
FIGS. 7 to 9 are schematic sectional views for explaining a fabrication process for the semiconductor memory device in accordance with another embodiment of the present invention.

In the same manner as described with reference to FIG. 4, an N-type region 7 is formed in a desired region of a P-type semiconductor substrate 1 for formation of a PMOS in a peripheral circuitry portion C, and a gate insulation film 4 is formed over the entire surface of the semiconductor substrate 1, as shown in FIG. 7. Thereafter, a mask pattern 5 having a plurality of elongate openings extending parallel to each other on a memory cell portion M is formed on the resulting substrate. By using the mask pattern 5 as a mask, arsenic ions, for example, are implanted into the substrate for formation of source/drain regions 2a in the memory cell portion M.

Figure 8:
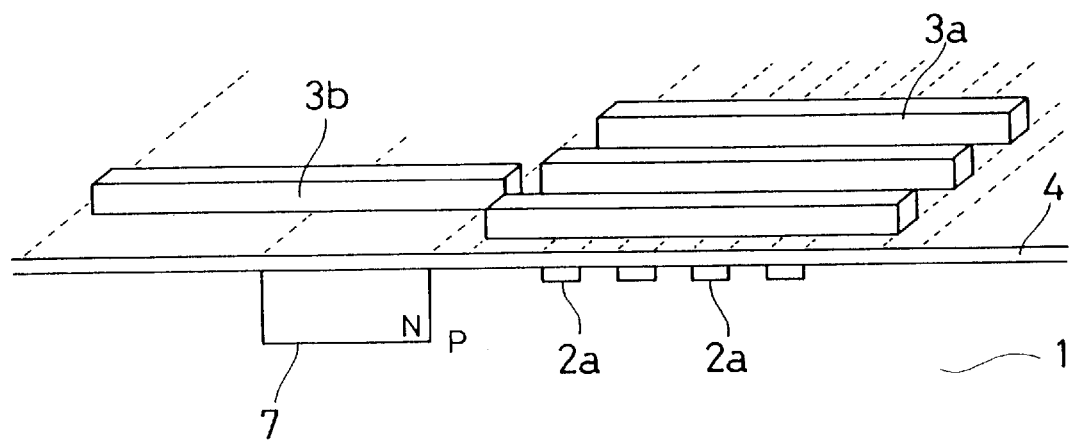

In turn, as shown in FIG. 8, a plurality of gate electrodes 3a extending perpendicular to the source/drain regions 2a are formed in the memory cell portion M and, at the same time, a gate electrode 3b is formed in the peripheral circuitry portion C.

Figure 9:
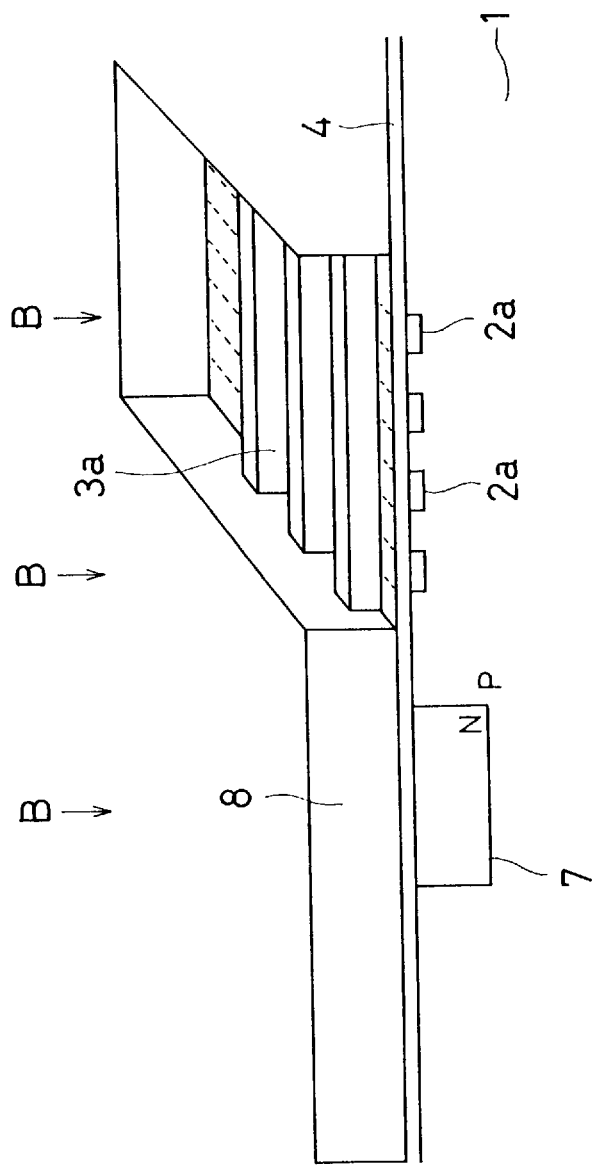

Subsequently, as shown in FIG. 9, a mask pattern 8 for ion implantation having an opening on the memory cell portion M is formed on the resulting substrate. By using the mask pattern 8 as a mask, P-type impurity ions such as boron ions are implanted into a portion of a surface layer of the semiconductor substrate 1 and into surface layers of the gate electrodes 3a in a dose of about $1 \times 10^{13}$ cm$^{-2}$ at an implantation energy of about 20 keV. The ion implantation allows the portion of the surface layer of the semiconductor substrate 1 and the surface layers of the gate electrodes 3a to have an impurity concentration of about $5 \times 10^{16}$ cm$^{-3}$ to about $1 \times 10^{18}$ cm$^{-3}$. By using the mask pattern 8 as a mask, P-type impurity ions such as boron ions are implanted through the gate electrodes 3a in a dose of about $2 \times 10^{12}$ cm$^{-2}$ at an implantation energy of about 200 keV which is higher than in the previous ion implantation so that the P-type impurity ions reach portions of the surface layer of the semiconductor substrate 1 below the gate electrodes 3a. The ion implantation allows the portions of the surface layer of the semiconductor substrate 1 below the gate electrodes 3a to have an impurity concentration of about $5 \times 10^{16}$ cm$^{-3}$ to about $1 \times 10^{18}$ cm$^{-3}$. Thus, the surface portion of the semiconductor substrate in the memory cell portion has a uniform impurity concentration which is higher than the impurity concentration in the surface portion of the semiconductor substrate in the NMOS region of the peripheral circuitry portion C.

Thereafter, source/drain regions 2b are formed in the peripheral circuitry portion C by ion implantation using the gate electrode 3b as a mask. An inter-layer insulation film, metal interconnections and the like are formed, and then ROM data writing is performed. Thus, the semiconductor memory device is completed.

Embodiment 3

A semiconductor memory device according to Embodiment 3 basically has the same construction as the semiconductor memory device shown in FIG. 1.

Figure 10:
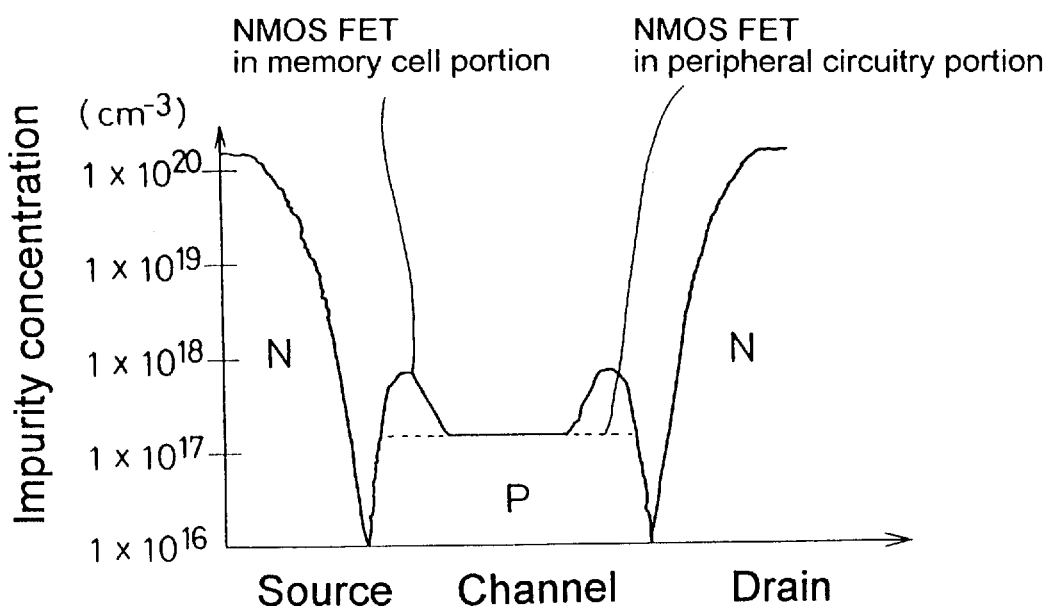
FIG. 10 is a graphical representation illustrating impurity profiles in transistors in a memory cell portion and a peripheral circuitry portion of another exemplary semiconductor memory device in accordance with the present invention.

Impurity profiles in surface portions of transistors in a memory cell portion M and a peripheral circuitry portion C of the semiconductor memory device are shown in FIG. 10. As shown, channels of the transistors in the memory cell portion M each have a higher impurity concentration in the periphery thereof, particularly, in a region thereof adjacent to a source region than in a middle portion thereof or in a channel of a transistor in the peripheral circuitry portion C, while the impurity profile in the channel of the transistor in the peripheral circuitry portion C is controlled by a conventional method. This suppresses the short channel effect which may occur in the transistors in the memory cell portion M, thereby permitting higher integration.

A method for fabricating the aforesaid semiconductor memory device will next be described with reference to FIGS. 11 and 12, which are sectional views taken along the line A–A' of FIG. 1.

Figure 11:
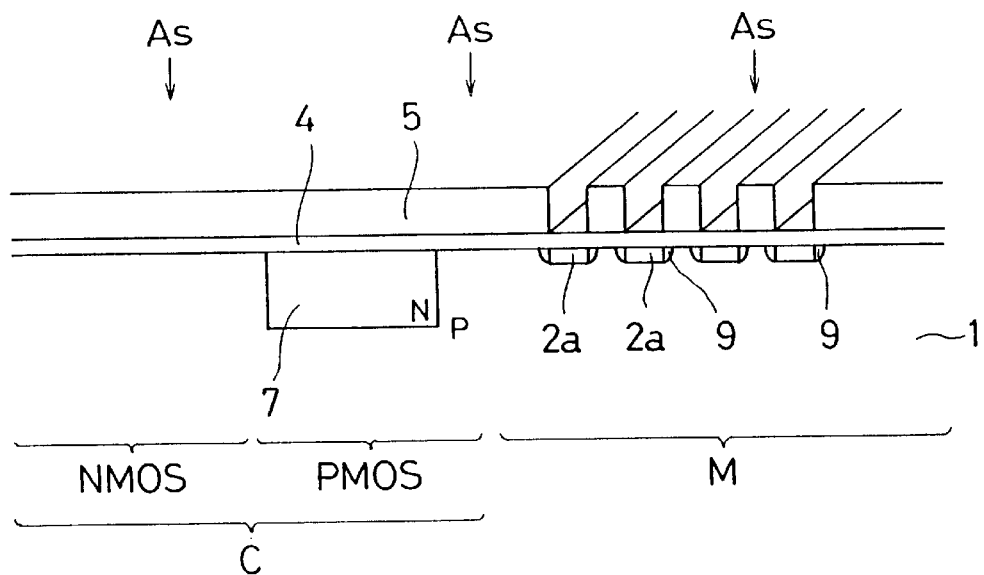
FIGS. 11 and 12 are schematic sectional views illustrating a fabrication process for the semiconductor memory device in accordance with still another embodiment of the present invention.
Figure 12:
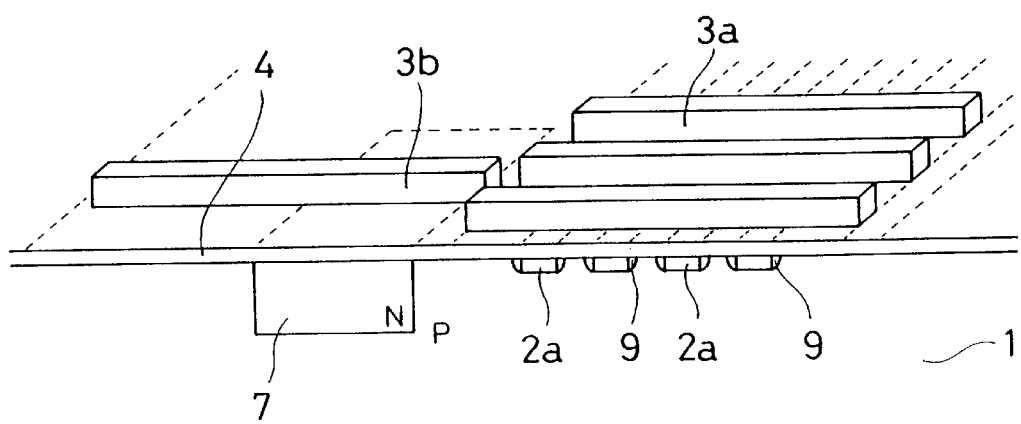
Figure 13:
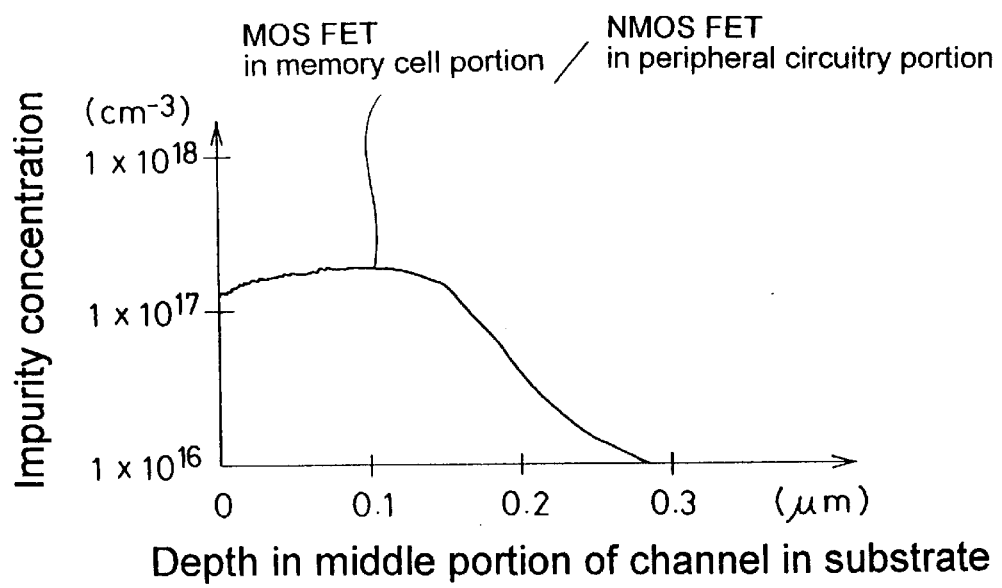
FIG. 13 is a graphical representation illustrating impurity profiles in channels of transistors in a memory cell portion and a peripheral circuitry portion of a conventional semiconductor memory device.
Figure 14:
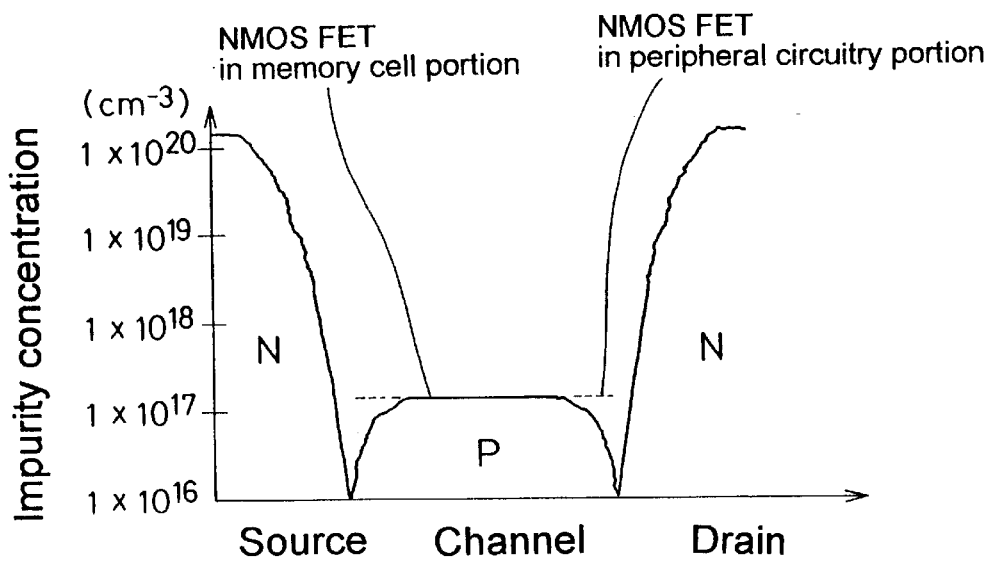
FIG. 14 is a graphical representation illustrating impurity profiles in the transistors in the memory cell portion and the peripheral circuitry portion of the conventional semiconductor memory device.

As shown in FIG. 11, an N-type region 7 is formed in a desired region of a P-type semiconductor substrate 1 in the same manner as in Embodiment 1 for formation of a PMOS in a peripheral circuitry portion C, and a gate insulation film 4 is formed over the entire surface of the semiconductor substrate 1. Thereafter, a mask pattern 5 having a plurality of elongate openings extending parallel to each other on a memory cell portion M is formed on the resulting substrate. By using the mask pattern 5 as a mask, arsenic ions are first implanted into the semiconductor substrate along a line normal to a surface of the substrate 1 in a dose of about $5 \times 10^{15}$ cm$^{-2}$ at an implantation energy of about 50 keV for formation of source/drain regions 2a in the memory cell portion M. By using the aforesaid mask pattern 5 as a mask, boron ions, for example, are implanted into the resulting substrate in a dose of about $5 \times 10^{13}$ cm$^{-2}$ at an implantation energy of about 20 keV at an angle of about 45° with respect to the line normal to the surface of the semiconductor substrate for formation of a P-type region 9 on opposite sides of the source/drain regions 2a, i.e., in regions adjacent to the periphery of a channel region. Thus, a surface portion of the semiconductor substrate formed with the transistor in the peripheral circuitry portion C has an impurity profile as shown in FIG. 10.

In the semiconductor memory device of a so-called planar cell structure according to the present invention, the first conductivity type channels of the transistors in the memory cell portion each have a higher impurity concentration than the first conductivity type channel of the transistor in the peripheral circuitry portion. Therefore, the short channel effect which may occur in the transistors in the memory cell portion can be suppressed without deterioration in the characteristics of the transistor in the peripheral circuitry portion. Thus, the integration level of the semiconductor memory device can be increased.

Further, the first conductivity type channels of the transistors in the memory cell portion each have a higher impurity concentration at least in the peripheral portion thereof adjacent to the source region than in the middle portion thereof. Therefore, the short channel effect which may occur in the transistors in the memory cell portion can be suppressed without deterioration in the characteristics of the transistor in the peripheral circuitry portion. Thus, the integration level of the semiconductor memory device can be increased.

Still further, driver circuits for controlling a gate voltage are connected to the first conductivity type channel transistors in the memory cell portion of the semiconductor memory device. Where the driver circuits are connected to a boost circuit for supplying a voltage higher than the supply voltage supplied to the semiconductor memory device, the semiconductor memory device is provided with the sense circuit which is capable of sensing a voltage applied to a drain of each transistor in the memory cell portion with a sufficiently high voltage being applied to the gate electrode of the transistor to respond to slight fluctuation in the drain voltage. In addition, not only the operation speed of the transistors in the peripheral circuitry portion but also the response speed of the transistors in the memory cell portion can be increased. This allows the semiconductor memory device to operate at a higher speed.

In accordance with the present invention, the methods for fabricating a semiconductor memory device can suppress the short channel effect of a memory cell MOS FET by employing a conventional CMOS process without an increase in the number of photolithographic process steps and without deterioration in the characteristics of the transistor in the peripheral circuitry portion. Therefore, the methods make it possible to fabricate a semiconductor memory device with an increased integration level.

Particularly, where ion implantation is performed to prevent the short channel effect of the transistors in the memory cell portion prior to the formation of the gate electrode, the prevention of the short channel effect can be achieved in consideration of the depth of the source/drain regions of the transistors.

What is claimed is:

1. A method for fabricating a semiconductor memory device, comprising the steps of:
    (i-a) forming a first mask having a plurality of openings on a memory cell portion of a semiconductor substrate, and implanting an impurity of a first conductivity type into the semiconductor substrate with the use of the first mask to form a plurality of source/drain regions of the first conductivity type extending parallel to each other;
    (ii-a) forming on the semiconductor substrate a second mask having at least an opening which entirely exposes the memory cell portion, and implanting an impurity of a second conductivity type into the semiconductor substrate with the use of the second mask; and
    (iii-a) forming at least one gate electrode extending perpendicular to the plurality of source/drain regions of the first conductivity type on the memory cell portion.

2. A method for fabricating a semiconductor memory device, comprising the steps of:
    (i-b) forming a first mask having a plurality of openings on a memory cell portion of a semiconductor substrate, and implanting an impurity of a first conductivity type into the semiconductor substrate with the use of the first mask to form a plurality of source/drain regions of the first conductivity type extending parallel to each other;
    (ii-b) forming at least one gate electrode extending perpendicular to the plurality of source/drain regions of the first conductivity type on the memory cell portion;
    (iii-b) forming on the semiconductor substrate a second mask having at least an opening which entirely exposes the memory cell portion;
    (iv-b) implanting impurity ions of a second conductivity type into a portion of a surface layer on the semiconductor substrate and into a surface layer of a gate electrode with the use of the second mask; and (v-b) implanting impurity ions of the second conductivity type through the gate electrode with the use of the second mask to cause the impurity ions to reach a portion of the surface layer of the semiconductor substrate below the gate electrode, wherein the step (v-p) either preceding or following the step (iv-b).

3. A method for fabricating a semiconductor memory device, comprising the steps of:

(i-c) forming a mask having a plurality of openings on a memory cell portion of a semiconductor substrate;

(ii-c) implanting an impurity of a first conductivity type into the semiconductor substrate along a line normal to a surface of the substrate with the use of the mask to form a plurality of source/drain regions of a first conductivity type extending parallel to each other;

(iii-c) implanting an impurity of a second conductivity type into the semiconductor substrate at an angle with respect to the line normal to the surface of the substrate with the use of the mask to allow each of channel regions defined between the source/drain regions to have a higher impurity concentration at least in a peripheral portion thereof adjacent to a source region of the first conductivity type than in a middle portion thereof, the step (iii-c) either preceding or following the step(ii-c); and (iv-c) forming at least one gate electrode extending perpendicular to the plurality of source/drain regions of the first conductivity type in the memory cell portion.

4. A method for fabricating a semiconductor memory device of claim 3 wherein implantation is carried out at an angle more than 0° and 45° or less with respect to a line normal to a surface of the substrate in the step (iii-c).

* * * * *